United States Patent
Bothra et al.

[11] Patent Number: 6,093,658
[45] Date of Patent: Jul. 25, 2000

[54] METHOD FOR MAKING RELIABLE INTERCONNECT STRUCTURES

[75] Inventors: Subhas Bothra, San Jose; Harlan Lee Sur, Jr., San Leandro; Victor C. Liang, Milpitas, all of Calif.

[73] Assignee: Philips Electronics North America Corporation, Tarrytown, N.Y.

[21] Appl. No.: 08/995,651

[22] Filed: Dec. 22, 1997

[51] Int. Cl.[7] .................................................. H01L 21/302
[52] U.S. Cl. ........................ 438/745; 438/747; 438/753; 438/756
[58] Field of Search ................................... 438/710, 720, 438/723, 724, 714, 745, 717, 702

[56] References Cited

U.S. PATENT DOCUMENTS

| | | | |
|---|---|---|---|
| 4,576,884 | 3/1986 | Reisman | 430/30 |
| 4,665,610 | 5/1987 | Barth | 29/580 |
| 4,668,335 | 5/1987 | Mockler et al. | 156/643 |
| 4,879,257 | 11/1989 | Patrick | 437/195 |
| 4,906,586 | 3/1990 | Blackburn | 437/40 |
| 5,024,747 | 6/1991 | Turner et al. | 204/298.09 |
| 5,030,590 | 7/1991 | Amini et al. | 437/233 |
| 5,134,085 | 7/1992 | Gilgen et al. | 437/52 |
| 5,244,534 | 9/1993 | Yu et al. | 156/636 |
| 5,281,320 | 1/1994 | Turner et al. | 204/298.15 |
| 5,744,012 | 4/1998 | Park | 204/192.34 |
| 5,793,105 | 8/1998 | Pace | 257/700 |
| 5,808,210 | 9/1998 | Herb et al. | 73/862.59 |
| 5,893,756 | 4/1999 | Berman et al. | 438/692 |
| 5,928,968 | 7/1999 | Bothra et al. | 438/745 |

OTHER PUBLICATIONS

S.T. Cho, K. Najafi, C.L. Lowman and K.D. Wise, "*An Ultrasensitive Silicon Pressure–Based Flowmeter*", 1989 IEEE, Center for Integrated Sensors and Circuits, Dept. of Electrical Engineering and Computer Science, University of Michigan, Ann Arbor, MI.

S. Wolf, Ph.D. and R. Tauber, Ph.D., "*Silicon Processing for the VLSI Era*", vol. 1: Process Technology, Lattice Press, Sunset Beach, CA.

Primary Examiner—Benjamin L. Utech
Assistant Examiner—Lan Vinh
Attorney, Agent, or Firm—Martine Penilla & Kim, LLP

[57] ABSTRACT

Disclosed is a method for making reliable interconnect structures on a semiconductor wafer having a first dielectric layer. The method includes plasma patterning a first metallization layer over the first dielectric layer. Forming a second dielectric layer over the first metallization layer and the first dielectric layer. Forming a plurality of tungsten plugs in the second dielectric layer, such that each of the plurality of tungsten plugs are in electrical contact with the first metallization layer. Plasma patterning a second metallization layer over the second dielectric layer and the plurality of tungsten plugs, such that at least a gap over at least one of the tungsten plugs is not covered by the second metallization layer and a positive charge is built-up on at least part of the second metallization layer. The method further includes exposing the semiconductor wafer to an electron dose that is configured to neutralize the positive charge that is built-up on the at least part of the second metallization layer. The neutralizing is thus configured to substantially prevent tungsten plug erosion.

12 Claims, 6 Drawing Sheets

METHOD FOR MAKING RELIABLE INTERCONNECT STRUCTURES

CROSS REFERENCE TO RELATED APPLICATIONS

This application is related to the following U.S. patent applications: (1) Ser. No. 08/995,660, filed on the same day as the instant application, and entitled "Programmable Semiconductor Structures and Methods for Making the Same"; (2) Ser. No. 08/995,500, filed on the same day as the instant application, and entitled "Semiconductor Pressure Transducer Structures and Methods for Making the Same"; (3) Ser. No. 08/995,679, filed on the same day as the instant application, and entitled "Method and Apparatus for Preventing Electrochemical Erosion of Interconnect Structures"; and (4) Ser. No. 08/995,652, filed on the same day as the instant application, and entitled "Method and Apparatus For Rapidly Discharging Plasma Etched Interconnect Structures." These applications are hereby incorporated by reference.

BACKGROUND OF THE INVENTION

1. Field of the Invention

The present invention relates generally to semiconductor circuits and, more particularly, to a method for fabricating reliable interconnect structures in semiconductor integrated circuits.

2. Description of the Related Art

Interconnect structures of integrated circuits (ICs) generally take the form of patterned metallization lines that are used to electrically interconnect devices and to provide interconnection with external circuitry. By way of example, IC devices may include complementary metal oxide semiconductor ("CMOS") devices having diffused source and drain regions that are separated by channel regions, and gates that are located over the channel regions. In practice, an IC chip may include thousands or millions of devices, such as CMOS transistors.

Conventionally, a dielectric layer (e.g., silicon dioxide) is deposited over the devices that are formed on a substrate, and via holes are formed through the dielectric layer to the devices below. As is well known in the art, photolithography "patterning" is typically accomplished by depositing a photoresist layer over the dielectric layer, selectively exposing the photoresist to light through a patterned reticle having via hole patterns, developing the photoresist to form a photoresist via mask, and etching the exposed dielectric layer to form the via holes that lead to a lower level. Once the via holes are formed, a conductive material such as tungsten (W) is used to fill the via holes to define what are known as "tungsten plugs." Once the tungsten plugs are formed, a metallization layer is formed over the dielectric layer and the tungsten plugs. The metallization layer is then patterned using conventional photolithography and plasma etching techniques to define a first level of interconnect metal routing. This process may then be repeated if additional layers of interconnect structures are desired.

To facilitate discussion, FIG. 1 shows a cross-sectional view of a semiconductor substrate 100 having a number of layers fabricated thereon. In this example, the semiconductor substrate 100 has a first dielectric layer 102 deposed over its surface, and a first metallization layer 104 patterned over the first dielectric layer 102. A second dielectric layer 106 is then deposited over the first dielectric layer 102 and the first metallization layer 104. Before a second metallization layer 110 is patterned over the second dielectric layer, via holes are etched and filled with a tungsten material to form tungsten plugs 108. At this point, the second metallization layer 110 is plasma etched to define the desired interconnect lines.

As is well known, conventional plasma etching will cause the semiconductor substrate 100 to be negatively charged, and all metallization features 104/110 and tungsten plugs 108 (i.e., unless they are coupled to the substrate 100) to be positively charged. Once the plasma etching is complete, the substrate 100 is conventionally moved to a basic solution cleaning station where it is submerged in an effort to remove any polymer residues produced during the plasma etching.

Although the basic solution submersing works well in removing the polymer residues, if any one of the tungsten plugs 108 are exposed to the basic solution, the tungsten material will erode away (also known in the art as "corrosion"). As shown in FIG. 1, tungsten plugs 108a are completely covered by the second metallization layer 110, however, a path 120 remains exposing tungsten plug 108b. As mentioned above, because the first metallization layer 104 and the second metallization layer 110 are not coupled to the substrate 100 (i.e., the structure is a floating structure), they will be positively charged and therefore the tungsten plug 108b will erode. If any tungsten plugs 108b erode, the entire IC chip may fail to operate for its intended purpose, thereby driving up fabrication costs.

Because CMOS semiconductor circuits are continuing to decrease in size, and more devices are packed into smaller IC chips, more densely integrated interconnect structures will be required. However, this dense integration has the effect of pushing the limits of conventional photolithography patterning, which necessarily makes photolithography mask misalignments more likely to occur. Of course, when more misalignments occur, more paths 120 will result, thereby increasing the number of exposed tungsten plugs 108b.

In view of the foregoing, there is a need for improved CMOS fabrication techniques that prevent any exposed tungsten plugs from eroding during the basic solvent cleaning operation.

SUMMARY OF THE INVENTION

Broadly speaking, the present invention fills these needs by providing a method that prevents exposed tungsten plugs from eroding during standard CMOS fabrication. It should be appreciated that the present invention can be implemented in numerous ways, including as a process, an apparatus, a system, a device, or a method. Several inventive embodiments of the present invention are described below.

In one embodiment, a method for making reliable interconnect structures on a semiconductor wafer having a first dielectric layer is disclosed. The method includes plasma patterning a first metallization layer over the first dielectric layer. Forming a second dielectric layer over the first metallization layer and the first dielectric layer. Forming a plurality of tungsten plugs in the second dielectric layer, such that each of the plurality of tungsten plugs are in electrical contact with the first metallization layer. Plasma patterning a second metallization layer over the second dielectric layer and the plurality of tungsten plugs, such that at least a gap over at least one of the tungsten plugs is not covered by the second metallization layer and a positive charge is built-up on at least part of the second metallization layer. The method further includes exposing the semiconductor wafer to an electron dose that is configured to neutralize the positive charge that is built-up on the at least part of the second metallization layer.

In another embodiment, a method for fabricating an interconnect structure on a semiconductor wafer that has a first dielectric layer, a first patterned metallization layer, a second dielectric layer over the first patterned metallization layer, and a plurality of tungsten plugs formed in the second dielectric layer is disclosed. The method includes patterning a second metallization layer that overlies the second dielectric layer and the plurality of tungsten plugs in a plasma etcher. In this manner, the patterning leaves at least one of the plurality of tungsten plugs not completely covered by the second metallization layer, and at least a portion of the second metallization layer, at least one tungsten plug and at least a portion of the first patterned metallization layer is charged to a positive potential. The method further includes exposing an uppermost surface of the semiconductor wafer to an electron dose that is configured to neutralize the positive potential to prevent tungsten plug erosion.

In yet another embodiment, a system for preventing erosion of tungsten plugs is disclosed. The system includes providing a semiconductor wafer that has at least one metallization layer and at least one tungsten plug lying under the at least one metallization layer. Plasma pattering the at least one metallization layer to form a metallization integrated circuit pattern. The metallization integrated circuit pattern is charged to a positive potential by the plasma pattering and is configured to substantially lie over and in electrical contact with the at least one tungsten plug. The system further includes applying an electron dose over the semiconductor wafer, and the electron dose is configured to neutralize the positive potential from the metallization integrated circuit pattern.

In still another embodiment, apparatus for preventing erosion of a tungsten plug in a semiconductor wafer that has at least one metallization layer that lies over the tungsten plug is disclosed. The apparatus includes means for plasma pattering the at least one metallization layer to form a metallization integrated circuit pattern. The metallization integrated circuit pattern is charged to a positive potential by the plasma pattering and is configured to substantially lie over and in electrical contact with the tungsten plug. The apparatus further includes means for applying an electron dose over the semiconductor wafer, and the electron dose is configured to neutralize the positive potential of the metallization integrated circuit pattern.

One advantage of the present invention is that very reliable interconnect structures can be fabricated without the danger of losing tungsten plugs to erosion (i.e., also known as "corrosion") in a basic solution used to remove post plasma etching polymer residues. Further, electron dose is highly efficient in rapidly discharging any positive potential of floating structures in a semiconductor wafer, without exposing transistor devices of the semiconductor wafer to gate oxide damage. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Therefore, like reference numerals designate like structural elements.

DETAILED DESCRIPTION OF THE PREFERRED EMBODIMENTS

An invention that prevents exposed tungsten plugs from eroding during standard CMOS fabrication is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
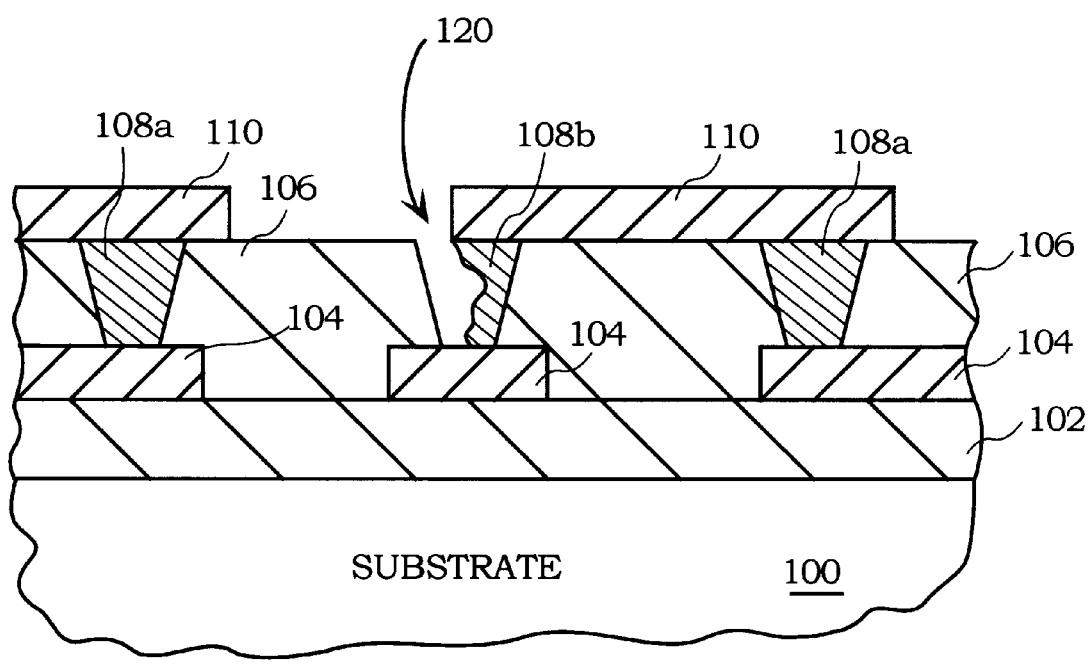
FIG. 1 shows a cross-sectional view of a semiconductor substrate having an eroded tungsten plug.
Figure 2:
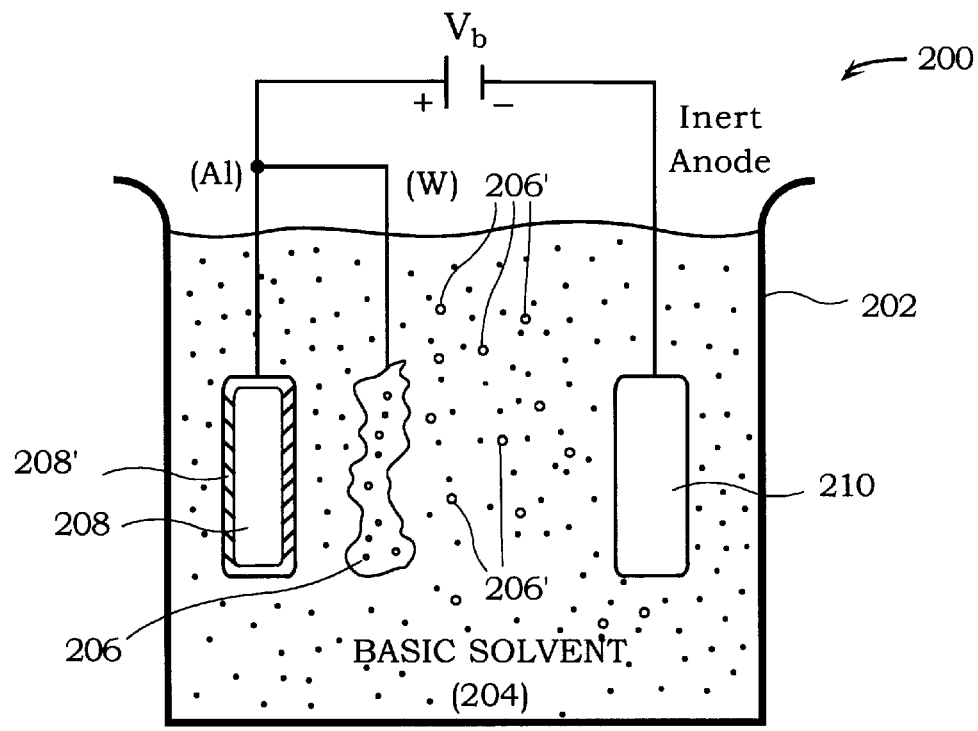
FIG. 2 shows a chemical reaction system having an aluminum electrode and a tungsten electrode submerged in a basic solution in accordance with one embodiment of the present invention.

FIG. 2 shows a chemical reaction system 200 having an aluminum electrode 208 and a tungsten electrode 206 submerged in a basic solution 204 in accordance with one embodiment of the present invention. In this example, both the aluminum electrode 208 and the tungsten electrode 206 are coupled to a positive bias voltage $V_b$, and a negative electrode 210 is coupled to a negative terminal of the bias voltage $V_b$. The basic solvent 204 is preferably an electrolyte that preferably has a pH level that is greater than about 7, and more preferably is greater than about 8, and most preferably is greater than about 10.

Although a chemical reaction between the aluminum electrode 208 and the basic solvent 204, and the tungsten electrode 206 and the basic solvent 204 will naturally occur without the application of a bias voltage $V_b$, the chemical reaction in the basic solvent 204 may be accelerated by applying the bias voltage $V_b$. For example, when the bias voltage $V_b$ is applied between the two electrodes, the tungsten electrode 206 will rapidly begin to erode by reacting with the basic solvent 204. This reaction produces tungsten oxide $WO_2$ 206' which rapidly dissolves in lightly basic solutions. Once the reaction begins, the tungsten will continue to oxidize until the tungsten electrode 206 is completely eroded. In contrast however, the aluminum electrode 208 will not erode in the basic solvent 204, but will form an aluminum oxide passivation layer 208'.

Figure 3A:
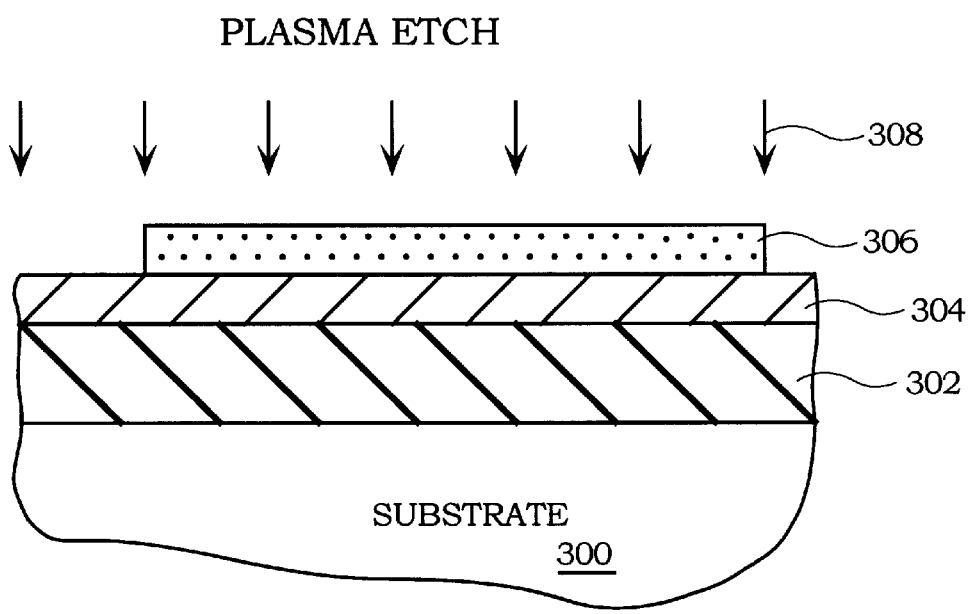
FIG. 3A shows a cross-sectional view of a partially fabricated semiconductor structure that is formed over a substrate in accordance with one embodiment of the present invention.

FIG. 3A shows a cross-sectional view of a partially fabricated semiconductor structure that is formed over a substrate 300 in accordance with one embodiment of the present invention. In an initial operation, an inter-metal oxide 302 is formed over the substrate 300, and then a metallization layer 304 is sputtered over the inter-metal oxide layer 302. In order to pattern the metallization layer 304, a photoresist mask 306 is formed over the metallization layer 304. As is well known, the photoresist mask 306 may be patterned using any number of well known techniques, including conventional photolithography.

Once the photoresist mask 306 has been formed, a plasma etching operation 308 is performed to remove the metallization layer 304 that is not covered by the photoresist mask 306. Although any plasma etcher may be used, one exemplary plasma etcher is a Lam Research TCP 9600 SE etcher, that is available from Lam Research of Fremont, Calif. In this embodiment, the plasma etcher is configured to negatively charge the substrate 300 to a negative potential (−), and the metallization layers that are not electrically connected to the substrate 300 (i.e., through conductive via structures), to a positive potential (+).

Figure 3B:
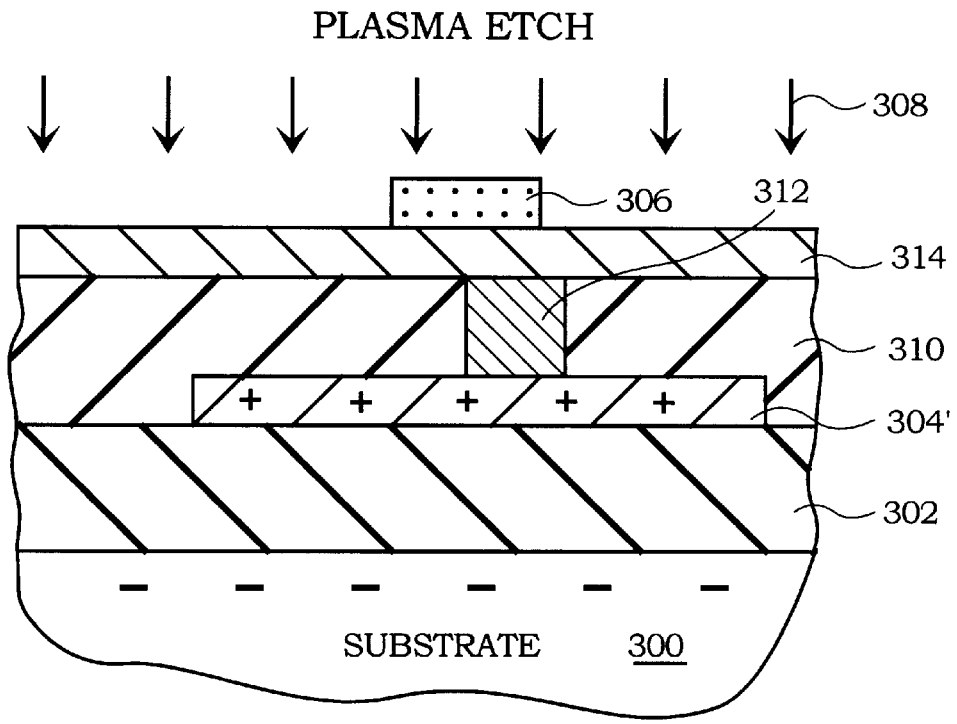
FIG. 3B shows a cross-sectional view of the semiconductor structure of FIG. 3A after a number of layers are fabricated over an inter-metal oxide layer and a patterned metallization layer in accordance with one embodiment of the present invention.

FIG. 3B shows a cross-sectional view of the semiconductor structure of FIG. 3A after a number of layers are fabricated over the inter-metal oxide layer 302 and a patterned metallization layer 304' in accordance with one embodiment of the present invention. As pictorially shown, the patterned metallization layer 304' was charged to a positive (+) potential, and is a floating structure that is not connected to a diffusion or gate of the substrate 300. In this example, an inter-metal oxide layer 310 was formed over the patterned metallization layer 304', and a tungsten plug 312 was formed within a via that was etched into the inter-metal oxide layer 310.

Figure 3C:
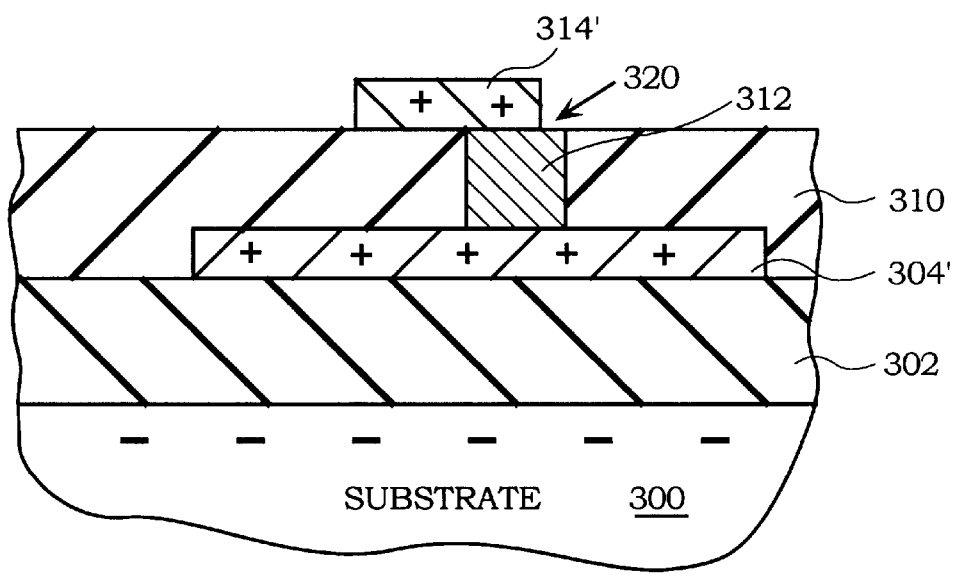
FIG. 3C shows the cross-sectional view of FIG. 3B after a top metallization layer is etched in a plasma etcher in accordance with one embodiment of the present invention.

After the tungsten plug 312 is formed into the inter-metal oxide layer 310, a metallization layer 314 is sputtered over the inter-metal oxide layer 310 and the tungsten plug 312. In order to pattern the metallization layer 314, a photoresist mask 306 is patterned over the metallization layer 314. In this example, the photoresist mask 306 may be patterned with an undesirable misalignment such that at least a portion of the tungsten plug 312 is exposed once the metallization layer 314 is etched. Therefore, once the plasma etch operation 308 is performed, the structure of FIG. 3C will result. As shown, a patterned metallization layer 314' will now lie over the inter-metal oxide layer 310, and over substantially all of the tungsten plug 312, except for a gap 320.

Because the plasma etching operations induce a positive charge "Q" (i.e., Q=C*V), that is equivalent to the capacitance "C" of the patterned metallization layers 304' and 314' multiplied by the induced plasma voltage, any misalignment produced gaps 320 will be vulnerable to erosion during submersion in a basic cleaning solution.

Figure 4:
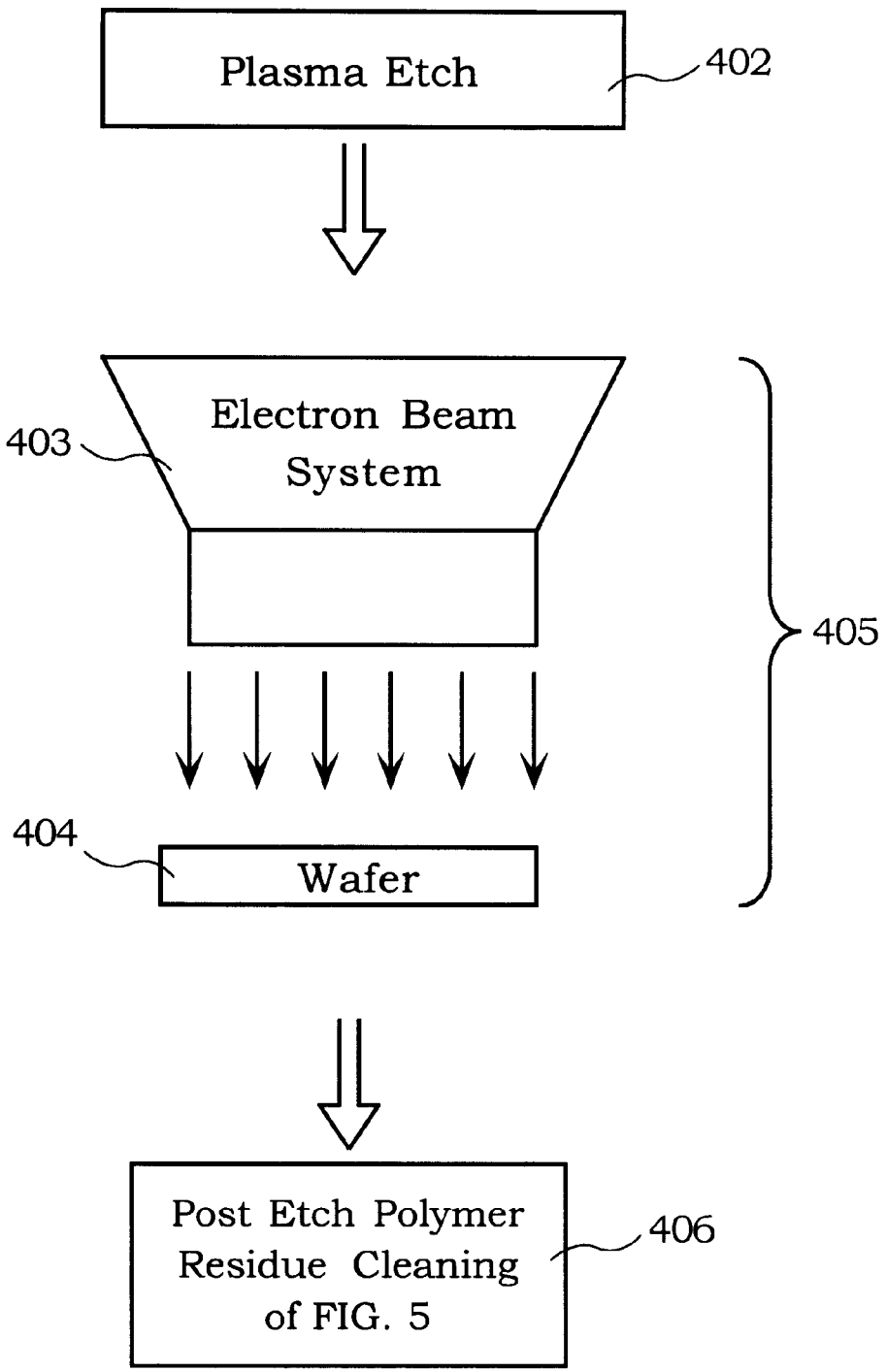
FIG. 4 shows preferred process operations that are used in fabricating a semiconductor wafer in accordance with one embodiment of the present invention.

FIG. 4 shows preferred process operations that are used in fabricating a semiconductor wafer 404 in accordance with one embodiment of the present invention. The process preferably begins when a plasma etch operation 402 is performed in order to define a plurality of metallization lines on a particular level of the semiconductor wafer 404. As mentioned above, when the plasma etch operation 402 is performed, there may be any number of floating structures, coupled by tungsten plugs, defined in the various levels of the semiconductor wafer 404. Therefore, these floating structures will be positively charged.

Once the plasma etch operation 402 is complete, the semiconductor wafer 404 is moved to an electron beam system 405. Once at the electron beam system 405, the topmost surface of the semiconductor wafer 404 is exposed to a negative electron dose. Preferably, the negative electron dose is between about 5,000 $\mu C/cm^2$ and about 25,000 $\mu C/cm^2$, and more preferably between about 7,500 $\mu C/cm^2$ and about 15,000 $\mu C/cm^2$, and most preferably about 10,000 $\mu C/cm^2$. Further, the negative electron dose is applied for a preferred period of time that is between about 110 seconds and about 560 seconds, and more preferably between about 168 seconds and about 338 seconds, and most preferably about 225 seconds.

In a preferred embodiment, an ElectronCure cluster tool, that is manufactured by Electron Vision Group of San Diego, Calif. can be used. Of course, other electron beam systems may also be used, so long as the electron does is sufficient to at least neutralize the positive charge in floating structures. Once the semiconductor wafer 404 is exposed to the electron dose, and the positive charges in the floating structures have been neutralized, the process will proceed to an operation 512. In operation 512, the semiconductor wafer 404 is subjected to a post etch polymer residue cleaning as described with reference to FIG. 5.

Figure 5:
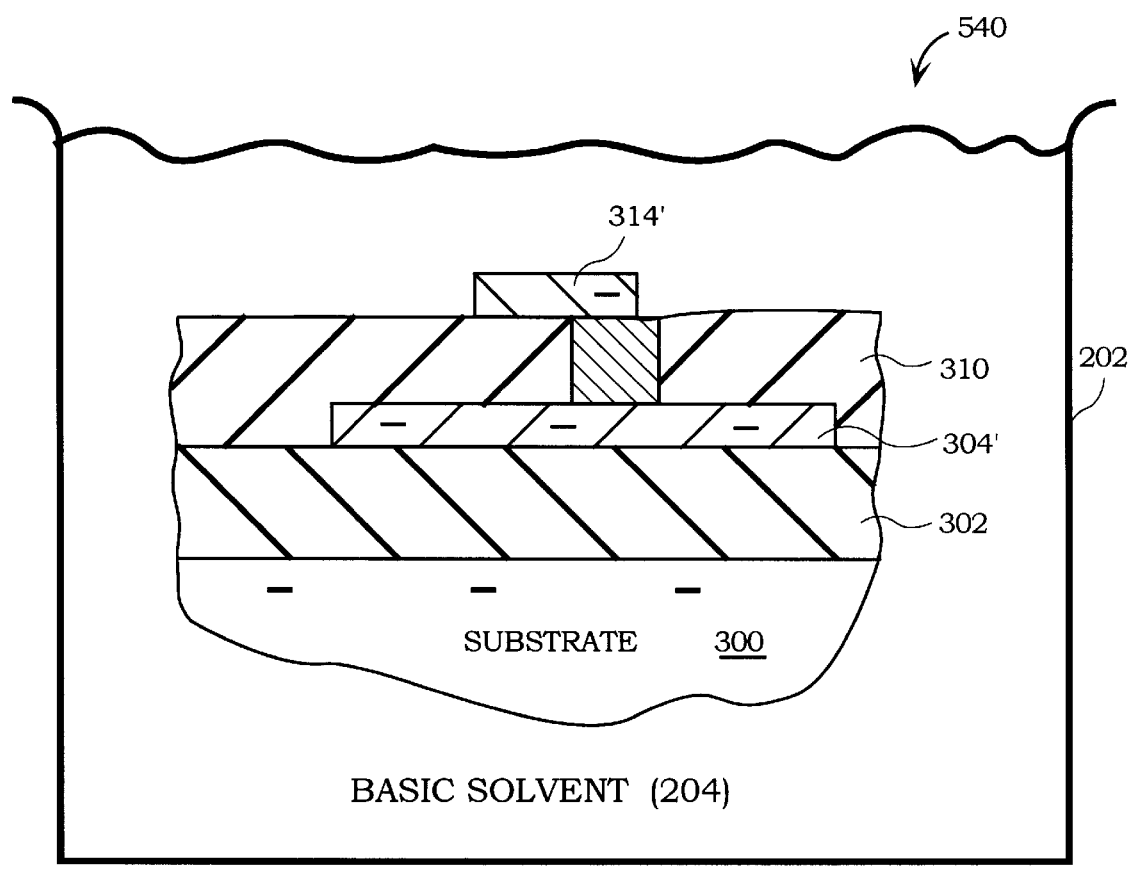
FIG. 5 shows the post-etch polymer residue cleaning system in accordance with one embodiment of the present invention.

FIG. 5 shows the post-etch polymer residue cleaning system 512 in accordance with one embodiment of the present invention. As shown, the substrate 300 and its fabricated layers are submerged in a basic solution 204 in order to remove any polymer residues that are formed during the plasma etching. Once the polymer residues have been cleaned off the surface of the fabricated layers of substrate 300, the substrate 300 is removed from the basic solvent 204. Further, as is well known in the art, the post-etch polymer residue cleaning may also include the stripping of any photoresist materials that are used in photolithography processes.

As mentioned above, the basic solution, that has a pH greater than about 7 is used to remove polymer residues that are introduced during plasma etching. Advantageously, because all of the exposed tungsten plugs that are connected to a floating features have now been neutralized, the tungsten plugs 312 will no longer erode in the basic solution. Further, because the tungsten plugs 312 remain intact, the interconnect structures will be more reliable.

Figure 6:
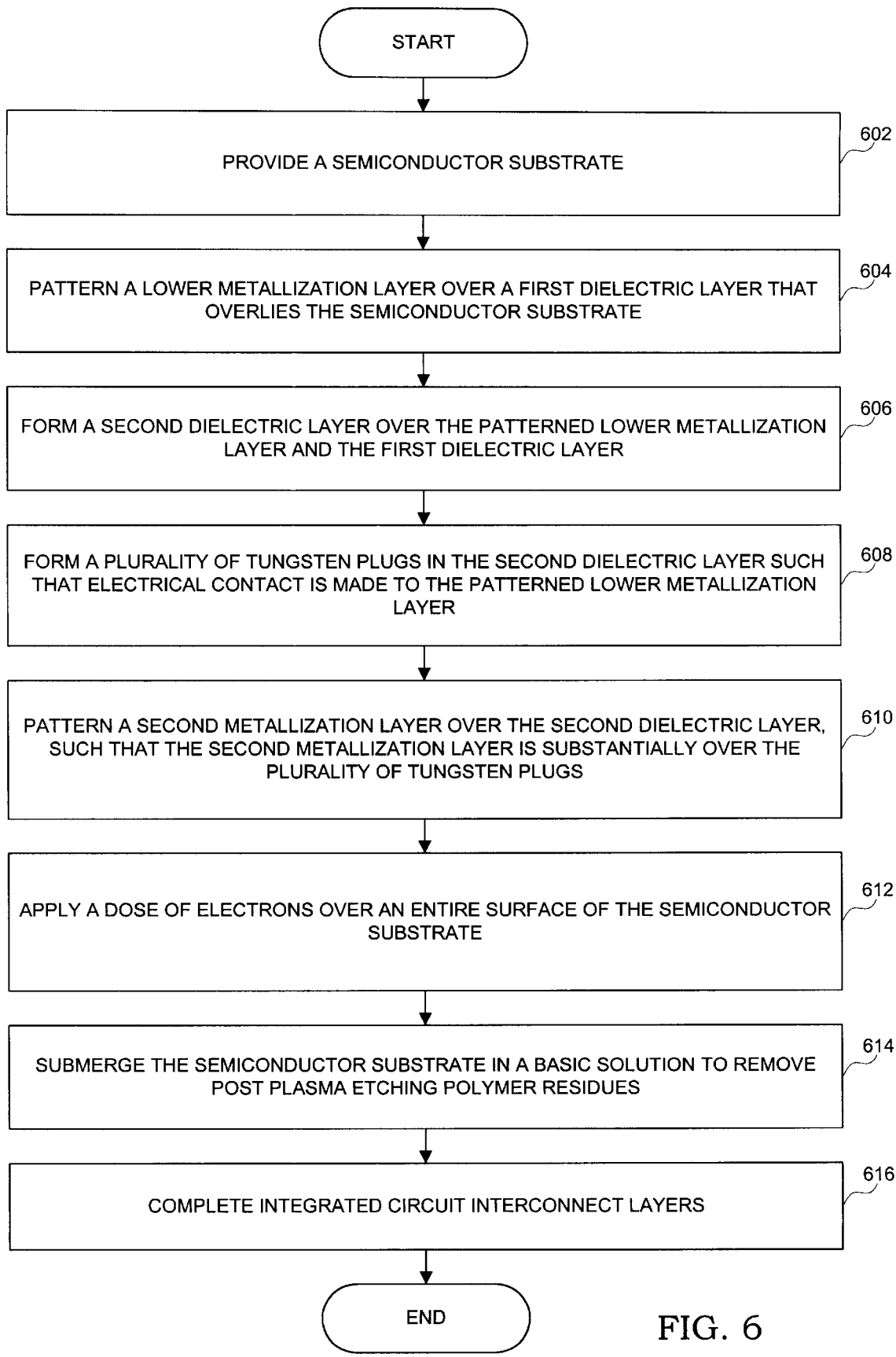
FIG. 6 is a flowchart diagram illustrating the preferred method operations used in fabricating reliable interconnect structures in accordance with one embodiment of the present invention.

FIG. 6 is a flowchart diagram illustrating the preferred method operations used in fabricating reliable interconnect structures in accordance with one embodiment of the present invention. The method begins at an operation 602 where a semiconductor substrate is provided. In general, the semiconductor substrate may be any substrate that may benefit from reliable tungsten plugs that are used in interconnect structures. The method then proceeds to an operation 604 where a lower metallization layer is patterned over a first dielectric layer that overlies the semiconductor substrate. Once the lower metallization layer has been patterned, the method will proceed to an operation 606 where a second dielectric layer is formed over the patterned lower metallization layer and the first dielectric layer. After the second dielectric layer has been formed, the method will proceed to an operation 608.

In operation 608, a plurality of tungsten plugs are formed into the second dielectric layer such that electrical contact is made with the patterned lower metallization layer. Next, a second metallization layer is patterned over the second dielectric layer, such that the second metallization layer is substantially over the plurality of tungsten plugs. Of course, it is a general intention that the tungsten plugs be completely covered by an overlying metallization line, however, photolithography misalignments tend to prevent perfect overlaps.

The method will then proceed to an operation 612 where a dose of negative electrons is applied to the surface of the semiconductor wafer 404 as shown in FIG. 4. The negative electrons are preferably well suited to remove any positive potential from floating features of a given wafer.

The method will now proceed to an operation 614 where the semiconductor substrate is submerged in a basic solution to remove post plasma etching polymer residues. The method will then proceed to an operation 616 where the remaining integrated circuit interconnect layers are completed, and the method will end. It should be understood that although reliable interconnect structures were described with regard to the first two metallization layers, the above described embodiments are equally applicable to other metallization layers.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for making reliable interconnect structures on a semiconductor wafer having a first dielectric layer, comprising:

plasma patterning a first metallization layer over the first dielectric layer;

forming a second dielectric layer over the first metallization layer and the first dielectric layer;

forming a plurality of tungsten plugs in the second dielectric layer, such that each of the plurality of tungsten plugs are in electrical contact with the first metallization layer;

plasma patterning a second metallization layer over the second dielectric layer and the plurality of tungsten plugs, such that at least a gap over at least one of the tungsten plugs is not covered by the second metallization layer and a positive charge is built-up on at least part of the second metallization layer;

exposing the semiconductor wafer to an electron dose that is configured to neutralize the positive charge that is built-up on the at least part of the second metallization layer; and submersing the semiconductor wafer in a basic solution to remove polymer residues caused by the plasma patterning, and the neutralizing of the positive charge is configured to prevent the at least one of the tungsten plugs not covered by the second metallization layer from eroding during the submersing.

2. A method for making reliable interconnect structures as recited in claim 1, wherein the basic solution has a pH level that is about 7 or greater.

3. A method for making reliable interconnect structures as recited in claim 2, further comprising:

fixing the electron dose to a range between about 5,000 $\mu C/cm^2$ and about 25,000 $\mu C/cm^2$.

4. A method for making reliable interconnect structures as recited in claim 2, further comprising:

fixing the electron dose to a range between about 7,500 $\mu C/cm^2$ and about 15,000 $\mu C/cm^2$.

5. A method for making reliable interconnect structures as recited in claim 3, further comprising:

applying the electron dose for a period of time that is between about 110 seconds and about 560 seconds.

6. A method for fabricating an interconnect structure on a semiconductor wafer that has a first dielectric layer, a first patterned metallization layer, a second dielectric layer over the first patterned metallization layer, and a plurality of tungsten plugs formed in the second dielectric layer, the method comprising:

patterning a second metallization layer that overlies the second dielectric layer and the plurality of tungsten plugs in a plasma etcher, such that the patterning leaves at least one of the plurality of tungsten plugs not completely covered by the second metallization layer, and at least a portion of the second metallization layer, at least one tungsten plug and at least a portion of the first patterned metallization layer is charged to a positive potential;

exposing an uppermost surface of the semiconductor wafer to an electron dose that is configured to neutralize the positive potential; and submersing the semiconductor wafer in a basic solution to remove polymer residues caused by the patterning in the plasma etcher, the neutralizing of the positive potential is configured to prevent the at least one of the tungsten plugs from eroding during the submersing.

7. A method for fabricating an interconnect structure on a semiconductor wafer as recited in claim 6, wherein the uppermost surface includes the second metallization layer, the at least one of the plurality of tungsten plugs not completely covered by the second metallization layer after the patterning, and the second dielectric layer.

8. A method for fabricating an interconnect structure on a semiconductor wafer as recited in claim 6, wherein the basic cleaning solution has a pH that is 7 or greater.

9. A method for fabricating an interconnect structure on a semiconductor wafer as recited in claim 6, further comprising:

fixing the electron dose to a range between about 5,000 $\mu C/CM^2$ and about 25,000 $\mu C/cm^2$.

10. A method for fabricating an interconnect structure on a semiconductor wafer as recited in claim 6, further comprising:

fixing the electron dose to a range between about 7,500 $\mu C/cm^2$ and about 15,000 $\mu C/cm^2$.

11. A method for fabricating an interconnect structure on a semiconductor wafer as recited in claim 9, further comprising:

applying the electron dose for a period of time that is between about 110 seconds and about 560 seconds.

12. A method for making reliable interconnect structures on a semiconductor wafer having a first dielectric layer, comprising:

plasma patterning a first metallization layer over the first dielectric layer;

forming a second dielectric layer over the first metallization layer and the first dielectric layer;

forming a plurality of tungsten plugs in the second dielectric layer, such that each of the plurality of tungsten plugs are in electrical contact with the first metallization layer;

plasma patterning a second metallization layer over the second dielectric layer and the plurality of tungsten plugs, such that at least a gap over at least one of the tungsten plugs is not covered by the second metallization layer and a positive charge is built-up on at least part of the second metallization layer;

exposing the semiconductor wafer to an electron dose that is configured to neutralize the positive charge that is built-up on the at least part of the second metallization layer, the electron dose being exposed at a range between about 5,000 $\mu C/cm^2$ and about 25,000 $\mu C/cm^2$; and submersing the semiconductor wafer in a basic solution to remove polymer residues caused by the plasma patterning.

* * * * *